United States Patent
Mudd et al.

(10) Patent No.: US 8,406,587 B2
(45) Date of Patent: Mar. 26, 2013

(54) QUAD SMALL FORM FACTOR PLUGGABLE (QSFP) ADAPTER MODULE

(75) Inventors: Ronald L. Mudd, Coppell, TX (US); Bradley S. Billman, Denton, TX (US); Richard L. Case, Omaha, NE (US); Paul F. Kolesar, McKinney, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 330 days.

(21) Appl. No.: 12/774,919

(22) Filed: May 6, 2010

(65) Prior Publication Data
US 2011/0274400 A1 Nov. 10, 2011

(51) Int. Cl.
*G02B 6/26* (2006.01)
*G02B 6/00* (2006.01)

(52) U.S. Cl. .......................... 385/31; 385/134
(58) Field of Classification Search .................. 385/31, 385/134
See application file for complete search history.

(56) References Cited

U.S. PATENT DOCUMENTS

| | | | |
|---|---|---|---|
| 6,364,539 B1 | 4/2002 | Shahid | |
| 6,758,600 B2 | 7/2004 | Del Grosso et al. | |
| 6,816,642 B1 * | 11/2004 | Mayer et al. | 385/24 |
| 6,869,227 B2 | 3/2005 | Del Grosso et al. | |
| 6,903,934 B2 * | 6/2005 | Lo et al. | 361/728 |
| 7,020,359 B2 * | 3/2006 | Mayer | 385/24 |
| 7,139,452 B2 * | 11/2006 | Mayer et al. | 385/24 |
| 7,237,966 B2 | 7/2007 | Quinby et al. | |
| 7,317,934 B2 | 1/2008 | Xu et al. | |
| 7,416,347 B2 | 8/2008 | Livingston et al. | |
| 7,581,891 B2 | 9/2009 | Wang | |
| 7,689,079 B2 * | 3/2010 | Burnham et al. | 385/51 |
| 7,756,371 B1 * | 7/2010 | Burnham et al. | 385/51 |
| 8,009,959 B2 * | 8/2011 | Barnes et al. | 385/147 |
| 2003/0002109 A1 * | 1/2003 | Hochberg et al. | 359/152 |
| 2004/0179771 A1 | 9/2004 | Verhagen et al. | |
| 2005/0053337 A1 * | 3/2005 | Mayer | 385/89 |
| 2005/0152640 A1 | 7/2005 | Lemoff | |
| 2006/0034573 A1 | 2/2006 | Guan et al. | |
| 2006/0133736 A1 | 6/2006 | Sullivan | |

(Continued)

OTHER PUBLICATIONS

Ilan Shakked, CommScope, "SYSTIMAX Upgrading Path to High Speed Fiber Optic Networks," http://docs.commscope.com/Public/Sys_MPO_High_Speed_Migration.pdf, Apr. 2008, pp. 1-6.

(Continued)

*Primary Examiner* — K. Cyrus Kianni
(74) *Attorney, Agent, or Firm* — Muncy, Geissler, Olds & Lowe, PLLC (57) ABSTRACT

Fiber adapter modules for use as interfaces at both ends of multi-fiber trunk cables position the channels of plural fiber optic transceivers onto fibers of the trunk cables in an efficient manner, such that normally dark fibers of a trunk cables are utilized. The fiber adapter modules include trunk-side ports for receiving adapters of multi-fiber trunk cables and transceiver-side ports for receiving adapters carrying both transmit channels and receive channels of fiber optic transceivers. Optical interconnections are provided within the fiber adapter modules to place at least one transmit channel or at least one receive channel of a first fiber optic transceiver at a first trunk-side port and to place at least one transmit channel or at least one receive channel of a second fiber optic transceiver at the first trunk-side port.

16 Claims, 7 Drawing Sheets

U.S. PATENT DOCUMENTS

| | | | |
|---|---|---|---|
| 2006/0177175 A1* | 8/2006 | Mayer et al. | 385/24 |
| 2007/0206905 A1 | 9/2007 | Swirhun et al. | |
| 2008/0205824 A1 | 8/2008 | Cody et al. | |
| 2008/0267620 A1* | 10/2008 | Cole et al. | 398/17 |
| 2009/0180737 A1* | 7/2009 | Burnham et al. | 385/59 |
| 2010/0098428 A1* | 4/2010 | Barnes et al. | 398/140 |
| 2010/0104278 A1* | 4/2010 | Livingston et al. | 398/41 |
| 2010/0195955 A1* | 8/2010 | Burnham et al. | 385/24 |
| 2010/0322554 A1* | 12/2010 | Barnes et al. | 385/24 |
| 2010/0322562 A1* | 12/2010 | Barnes et al. | 385/59 |
| 2010/0322579 A1* | 12/2010 | Cooke et al. | 385/135 |
| 2011/0103803 A1* | 5/2011 | Kolesar | 398/142 |
| 2011/0176779 A1* | 7/2011 | Kolesar | 385/77 |

OTHER PUBLICATIONS

Brian Ensign, Legrand Ortronics, "40/100 Gigabit Ethernet: Understanding the Next Generation of Network Technology," www.legrand.us/~/media/908E07603B414D088F171734A66DD173.ashx, Feb. 2010, pp. 1-8.

Tyco Electronics, "High Density PARA-OPTIX Cable Assemblies and Enclosures," http://www.ampnetconnect.com/documents/Paraoptix.pdf, Jul. 26, 2007, pp. 1-2.

Avago Technologies Limited, HFBR-7934WZ/EWZ/HMZ/EHWZ Four-Channel Pluggable Parallel Fiber Optic Transceiver Data Sheet, AV02-1185EN, Apr. 18, 2008.

* cited by examiner

QUAD SMALL FORM FACTOR PLUGGABLE (QSFP) ADAPTER MODULE

BACKGROUND OF THE INVENTION

1. Field of the Invention

The present invention relates to a module to enable better utilization of fibers within multi-fiber trunk cables. More particularly, the present invention relates to an adapter module to facilitate a connection between a plurality of fiber optic transceivers and a plurality of multi-fiber trunk cables.

2. Description of the Related Art

Figure 1:
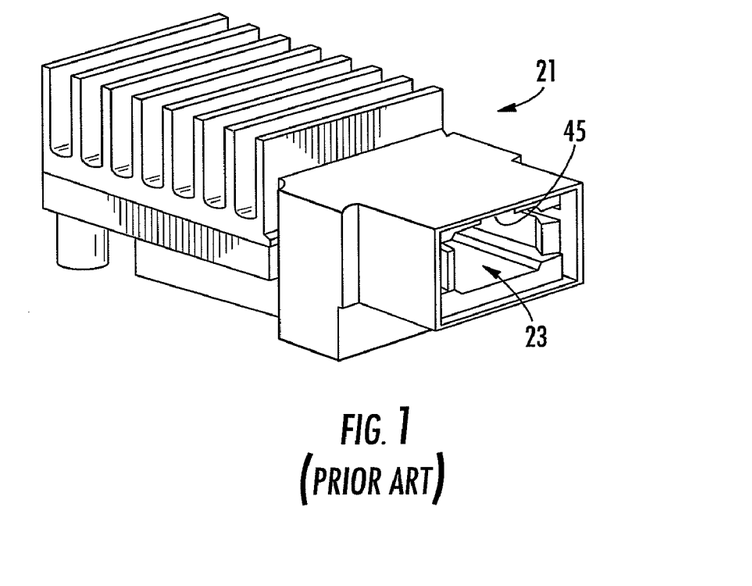
FIG. 1 is a perspective view of a fiber optic transceiver in accordance with the prior art.
Figure 3:
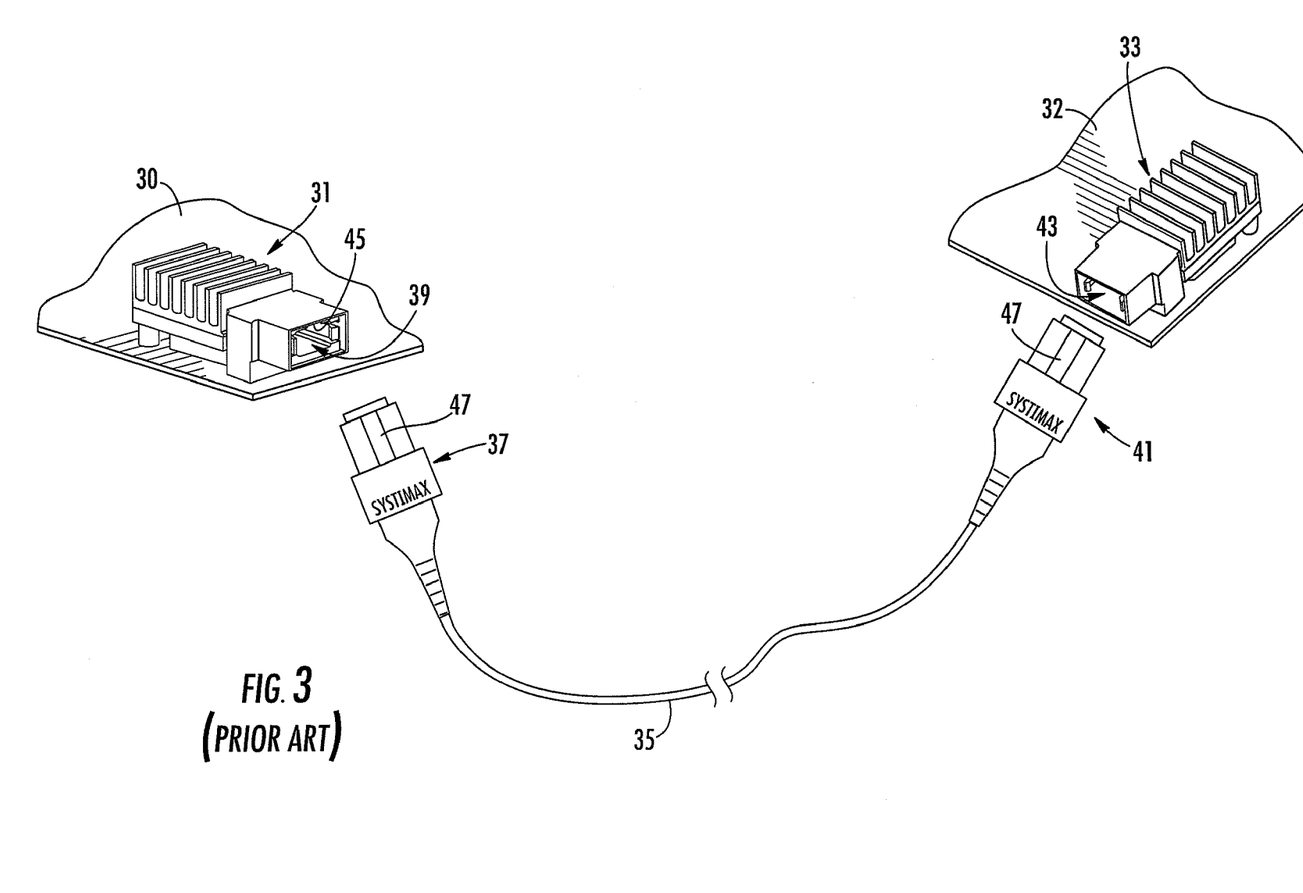
FIG. 3 is a perspective view of first and second fiber optic transceivers connected by a multi-fiber trunk cable, in accordance with the prior art.

As illustrated in FIG. 1, a known fiber optic transceiver 21 has a twelve fiber, multiple-fiber push-on/pull-off (MPO) receptacle 23 that accepts an MPO connector plug 47 shown in FIG. 3. More detail concerning the MPO receptacle 23, the MPO connector plug 47 and an associated multi-fiber trunk cable can be found in the Assignee's prior U.S. Pat. No. 7,416,347, which is herein incorporated by reference. The multiple-fiber push-on/pull-off (MPO) connector is generally known in the art. Such connectors relate to IEC-61754-7 and EIA/TIA 604-5 (FOCIS 5) standards. The internal structures and functioning of the fiber optic transceiver 21 are also known in the art and not needed for an understanding of the present invention. Therefore, reference can be had to the prior art for a better understanding of the fiber optic transceiver 21.

Figure 2:
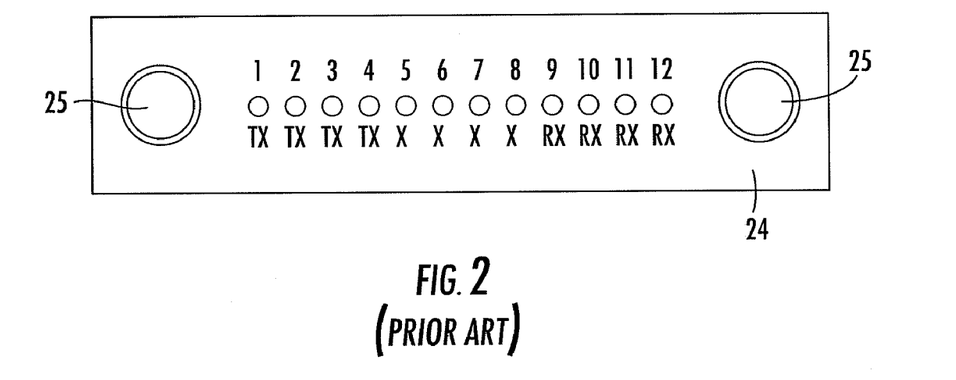
FIG. 2 is a front view of the mating face of an MPO port of the fiber optic transceiver of FIG. 1.

FIG. 2 depicts the fiber mating face within the MPO receptacle 23 of FIG. 1. The MPO mating face has four transmit channels (Tx) and four receive channels (Rx). Typically, the first four channels 1-4 are used for transmission of data and the last four channels 9-12 are used for the reception of data. The middle four channels 5-8 are unused, perhaps reserved for the future use of fiber optic transceivers with expanded abilities.

As seen in FIG. 2, the MPO receptacle 23 contains an MPO mating face 24 with twelve fiber ends 1-12 arranged in a linear row between two alignment features 25, such as alignment pins or alignment holes. An MPO receptacle containing an MPO mating face will be referred to as an MPO port. FIG. 2 is depicting the alignment features 25 as alignment pins, and as such the fiber optic transceiver 21 has a male MPO port designed to receive a female MPO connector plug without pins of an incoming fiber optic trunk cable or patch cord.

FIG. 3 illustrates a connection between a first fiber optic transceiver 31 on a first printed circuit board 30 and a second fiber optic transceiver 33 on a second printed circuit board 32, both having a same construction as the fiber optic transceiver 21 of FIG. 1. As illustrated, a multi-fiber trunk cable 35, having twelve optical fibers therein, is used to connect the first fiber optic transceiver 31 to the second fiber optic transceiver 33. A first female MPO connector plug 37 at a first end of the trunk cable 35 is provided for mating with a first male MPO port 39 of the first fiber optic transceiver 31. A second female MPO connector plug 41 at a second end of the trunk cable 35 is provided for mating with a second male MPO port 43 of the second fiber optic transceiver 33. In practice, the trunk cable 35 may extend over a long distance within a building environment (e.g., from a networking closet on a ground floor to a networking closet on a $20^{th}$ floor) or within a campus environment (e.g., from a computer lab building to a dormitory networking closet). The trunk cable 35's length could perhaps range from several meters up to one thousand meters.

Often, a keying arrangement is provided at the first and second MPO ports 39 and 43 and the first and second MPO connector plugs 37 and 41. In a known embodiment of the keying arrangement, the first and second MPO ports 39 and 43 include a slot 45 and the first and second MPO connector plugs 37 and 41 include a protruding rib 47, such that the first and second MPO connector plugs 37 and 41 may only be connected to the first and second MPO ports 39 and 43 in one orientation (i.e., in the "key up" orientation, as depicted).

Figure 4:
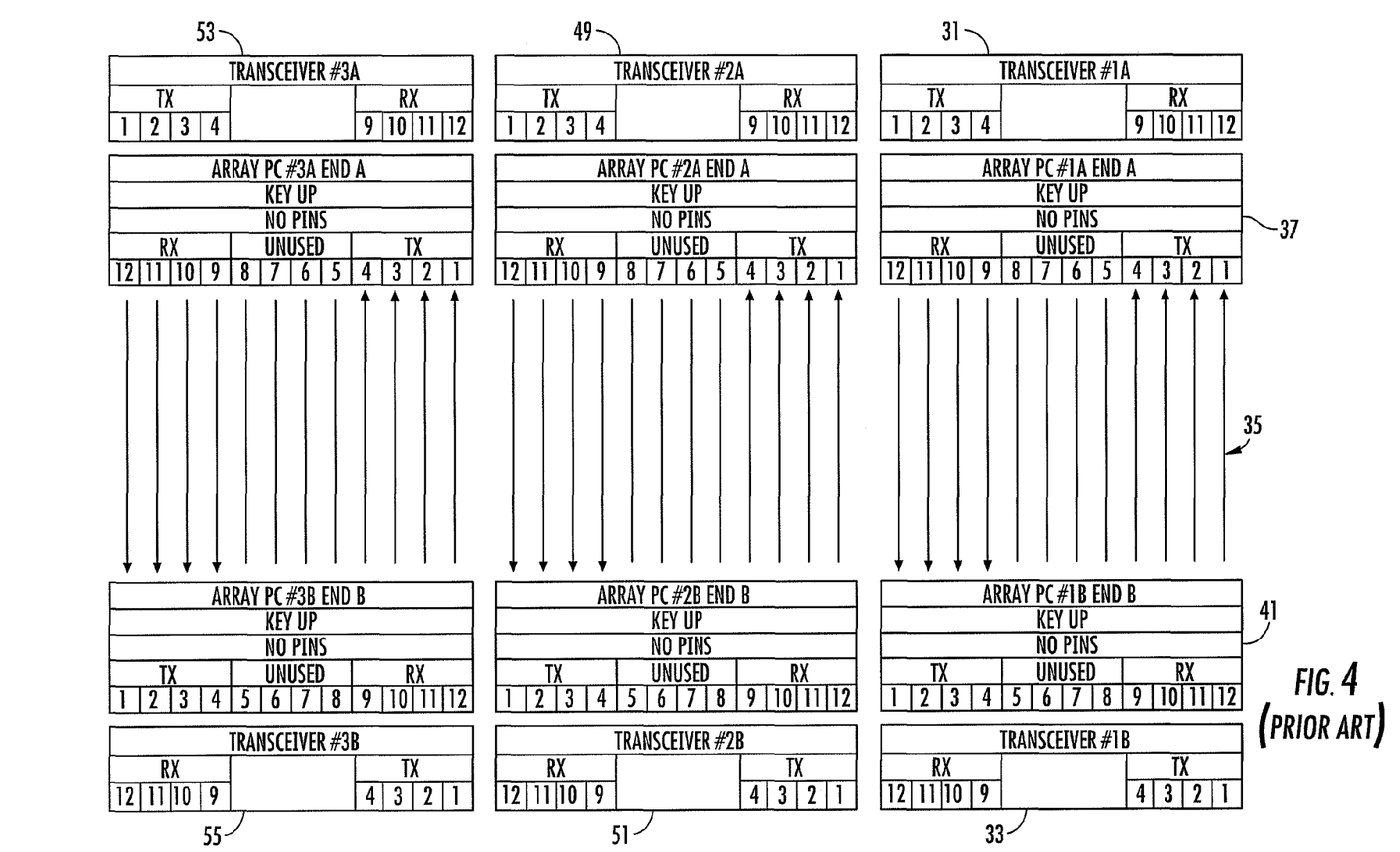
FIG. 4 a schematic diagram showing the interconnections of three local fiber optic transceivers with three remote fiber optic transceivers using three trunk cables with twelve fibers each, in accordance with the prior art.

FIG. 4 depicts the interconnections between the first and second fiber optic transceivers 31 and 33, as well as the interconnections between third and fourth fiber optic transceivers 49 and 51 and between fifth and sixth fiber optic transceivers 53 and 55, in accordance with the prior art. As can be seen in FIG. 4, four of the twelve fibers within the first trunk cable 35 connecting the first fiber optic transceiver 31 to the second fiber optic transceiver 33 are unused. Also, four of the twelve fibers within a second trunk cable connecting the third fiber optic transceiver 49 to the fourth fiber optic transceiver 51 are unused. Also, four of the twelve fibers within a third trunk cable connecting the fifth fiber optic transceiver 53 to the sixth fiber optic transceiver 55 are unused.

SUMMARY OF THE INVENTION

The Applicants have appreciated drawbacks with the structures of the background art.

The Applicants have appreciated that one third of the fibers in the trunk cables of the background art are unused in the arrangements illustrated in FIGS. 1-4. Having one third of the fibers in a twelve fiber cable dark or unused seems to be a waste of money and space. Often times, the trunk cables are routed through conduits in the ground, walls and/or ceiling, where the space is at a premium due to the competing need to use the conduit space for other data cables.

The Applicants have appreciated that three fiber optic transceivers require twelve transmit channels and twelve receive channels, and hence could communicate over two twelve fiber trunk cables, as opposed to the three trunk cables provided in accordance with the background art. To permit three fiber optic transceivers to communicate over two trunk cables, the Applicants have devised several embodiments of a fiber adapter module for use as an interface at both ends of multi-fiber trunk cables to transition the channels of plural fiber optic transceivers to the trunk cables in an efficient manner.

The Applicants have developed an adapter module which will permit the normally dark fibers of trunk cables to be utilized, meaning that fewer trunk cables, as compared to the prior art, need to be installed in order to service a same number of fiber optic transceivers, as compared to the prior art. Conversely, existing network systems with a given number of trunk cables already installed can be expanded to include more fiber optic transceivers without the need of providing and installing additional trunk cables.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 5:
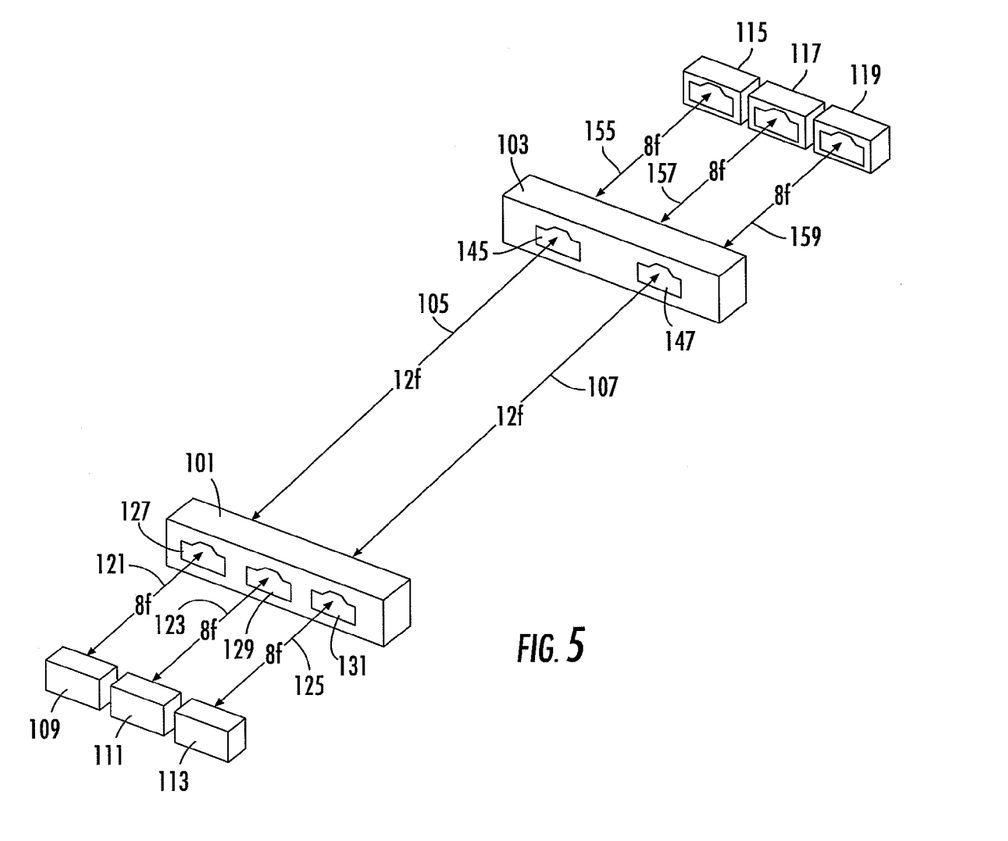
FIG. 5 is a perspective view of first and second fiber adapter modules used at the ends of first and second trunk cables to permit the interconnection of first through sixth fiber optic transceivers, in accordance with one embodiment of the present invention.

FIG. 5 is a perspective view of first and second fiber adapter modules 101 and 103 used at the ends of first and second multi-fiber trunk cables 105 and 107. The first and second fiber adapter modules 101 and 103 permit the interconnection of first, second and third fiber optic transceiver 109, 111 and 113 at a local location to fourth, fifth and sixth fiber optic transceivers 115, 117 and 119, respectively, at a remote location. The remote location may be several meters to one thousand meters from the local location, in accordance with one embodiment of the present invention.

The first fiber adapter module 101 is connected to the first, second and third fiber optic transceivers 109, 111 and 113 by relatively short (e.g. 0.3 to 6 meter long) first, second and third patch cords 121, 123 and 125, respectively. In one embodiment, the first, second and third patch cords 121, 123 and 125 are twelve fiber cords terminated at first ends with female twelve fiber MPO connector plugs, which mate to male twelve fiber MPO ports of the first, second and third fiber optic transceivers 109, 111 and 113 (whose male MPO ports may be identically constructed to the male MPO ports 23, 39 and 43 illustrated in FIGS. 1-3). The first, second and third patch cords 121, 123 and 125 are terminated at second ends with female twelve fiber MPO connector plugs, which mate to first, second and third male twelve fiber MPO transceiver-side ports 127, 129 and 131 on a housing of the first fiber adapter module 101. The first, second and third patch cords 121, 123 and 125 have four transmit fibers, four receive fibers and four dark fibers, as did the trunk cable 35 of FIG. 4. Hence, each of the first, second and third patch cords 121, 123 and 125 has eight active fibers (hence the "8f" designation in FIG. 5).

Figure 6:
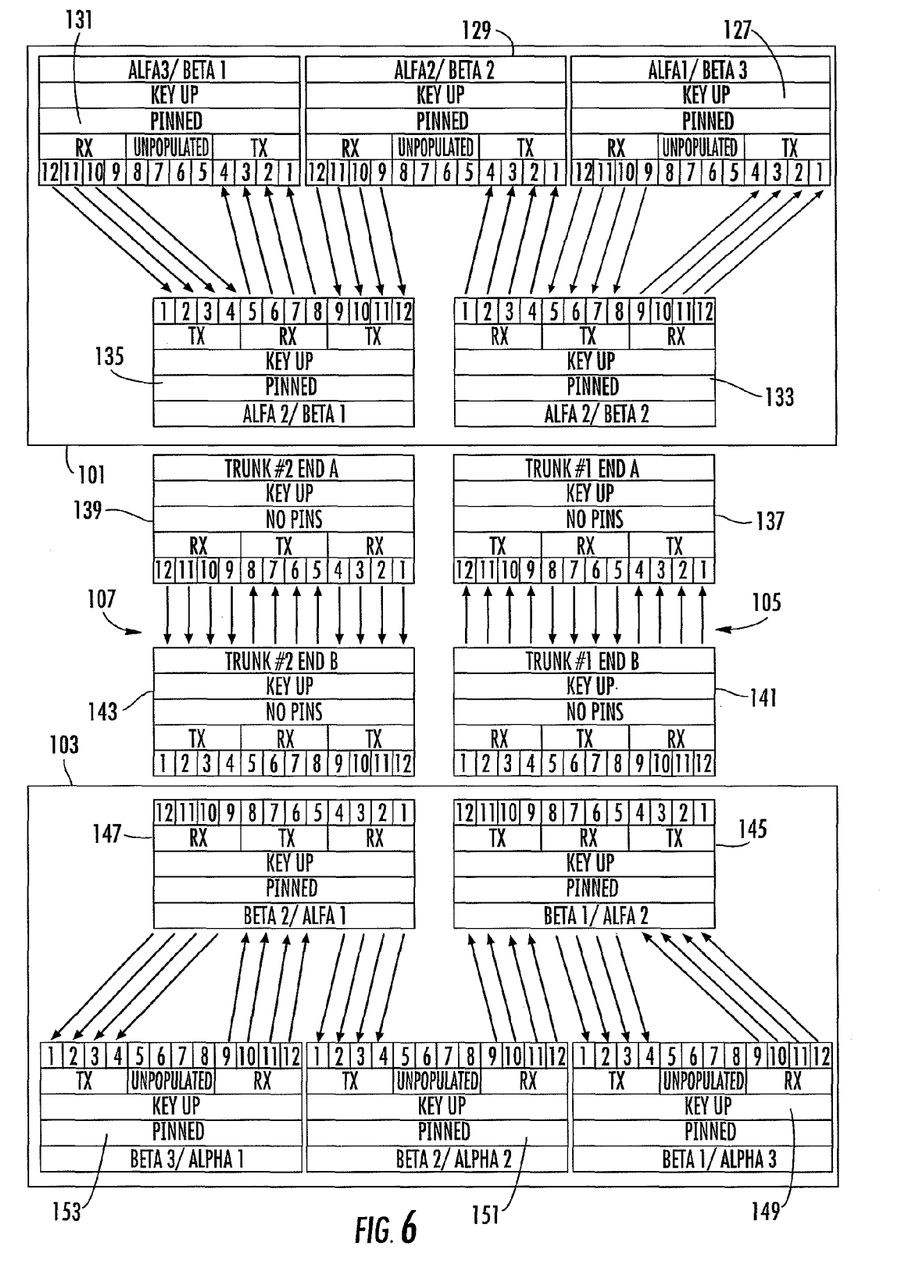
FIG. 6 is a schematic diagram showing the interconnections within and between the first and second fiber adapter modules of FIG. 5, in accordance with a first embodiment.

The first fiber adapter module 101 also includes first and second trunk-side ports 133 and 135 on its housing (best seen in FIG. 6). In one embodiment, the first and second trunk-side ports 133 and 135 are male twelve fiber MPO ports. The first and second trunk cables 105 and 107 are terminated at their first ends by first and second female twelve fiber MPO connector plugs 137 and 139, which mate to the first and second trunk-side ports 133 and 135. The first and second trunk cables 105 and 107 are terminated at their second ends by third and fourth female twelve fiber MPO connector plugs 141 and 143, which mate to the third and fourth trunk-side ports 145 and 147 on a housing of the second fiber adapter module 103.

The second fiber adapter module 103 also includes fourth, fifth and sixth male twelve fiber MPO transceiver-side ports 149, 151 and 153 on its housing (best seen in FIG. 6). The second fiber adapter module 103 is connected to the fourth, fifth and sixth fiber optic transceivers 115, 117 and 119 by relatively short (e.g. 0.3 to 6 meter long) fourth, fifth and sixth patch cords 155, 157 and 159, respectively. In one embodiment, the fourth, fifth and sixth patch cords 155, 157 and 159 are twelve fiber cords terminated at first ends with female twelve fiber MPO connector plugs, which mate to male twelve fiber MPO ports of the fourth, fifth and sixth fiber optic transceivers 115, 117 and 119 (which may be identically constructed to the male MPO ports 23, 39 and 43 illustrated in FIGS. 1-3). The fourth, fifth and sixth patch cords 155, 157 and 159 are terminated at second ends with female, twelve fiber, MPO connector plugs, which mate to the fourth, fifth and sixth male, twelve fiber, MPO transceiver-side ports 149, 151 and 153 of the second fiber adapter module 103. The fourth, fifth and sixth patch cords 155, 157 and 159 have four transmit fibers, four receive fibers and four dark fibers, as did the trunk cable 35 of FIG. 4. Hence, each of the fourth, fifth and sixth patch cords 155, 157 and 159 has eight active fibers (hence the "8f" designation in FIG. 5).

FIG. 6 illustrates a first embodiment of the optical interconnections within and between the first and second fiber adapter modules 101 and 103. It will be appreciated that the positioning or ordering of transmit and receive channels into the first and second trunk cables 105 and 107 accomplished by the first fiber adapter module 101 is reversed by the second fiber adapter module 103, so that the optical signals received by the first through sixth fiber optic transceivers 109, 111, 113, 115, 117 and 119 are identical to the signals received in the prior art of FIG. 4, as if three trunk lines were provided in the fashion depicted in FIG. 4.

In FIG. 6, the four transmit channels (e.g., channels 1-4) of the first fiber optic transceiver 109 pass thru patch cord 121 (shown in FIG. 5) and enter into the receive (Rx) channels 9-12 of the first transceiver-side port 127 and are passed to the transmit (Tx) channels 5-8 of the first trunk-side port 133. The four receive (Rx) channels 9-12 of the first trunk-side port 133 are passed to the four transmit (Tx) channels 1-4 of the first receiver-side port 127, then exit the first receiver-side port 127 into patch cord 121 for connection to the four receive channels (e.g., channels 9-12) of the first fiber optic transceiver 109.

The four transmit channels (e.g., channels 1-4) of the second fiber optic transceiver 111 pass thru patch cord 123 (shown in FIG. 5) and enter into the receive (Rx) channels 9-12 of the second transceiver-side port 129 and are passed to the transmit (Tx) channels 9-12 of the second trunk-side port 135. The four receive (Rx) channels 1-4 of the first trunk-side port 133 are passed to the four transmit (Tx) channels 1-4 of the second transceiver-side port 129, then exit the second transceiver-side port 129 into patch cord 123 for connection to the four receive channels (e.g., channels 9-12) of the second fiber optic transceiver 111.

The four transmit channels (e.g., channels 1-4) of the third fiber optic transceiver 113 pass thru patch cord 125 (shown in FIG. 5) and enter into the receive (Rx) channels 9-12 of the third transceiver-side port 131 and are passed to the transmit (Tx) channels 1-4 of the second trunk-side port 135. The four receive (Rx) channels 5-8 of the second trunk-side port 135 are passed to the four transmit (Tx) channels 1-4 of the third transceiver-side port 131, then exit the third transceiver-side port 131 into patch cord 125 for connection to the four receive channels (e.g., channels 9-12) of the third fiber optic transceiver 113.

The signals at the first and second trunk-side ports 133 and 135 are connected to the first and second trunk connector plugs 137 and 139 at the first ends of the first and second trunk cables 105 and 107. The signals pass along the first and second trunk cables 105 and 107 to/from the third and fourth trunk connector plugs 141 and 143 which are connected to the third and fourth trunk-side ports 145 and 147 of the second fiber adapter module 103, respectively.

At the second fiber adapter module 103, the signals from/to the third and fourth trunk-side ports 145 and 147 are connected to optical interconnections, the signal direction of which are reversed relative to the optical interconnections made in the first fiber adapter module 101. As illustrated, the two adapter modules 101 and 103 provide this functionality with identical internal signal routing. By this arrangement, the four transmit channels of the first fiber optic transceiver 109 communicate to the four receive channels of the fourth fiber optic transceiver 115, the four receive channels of the first fiber optic transceiver 109 communicate to the four transmit channels of the fourth fiber optic transceiver 115, and so forth.

Figure 7:
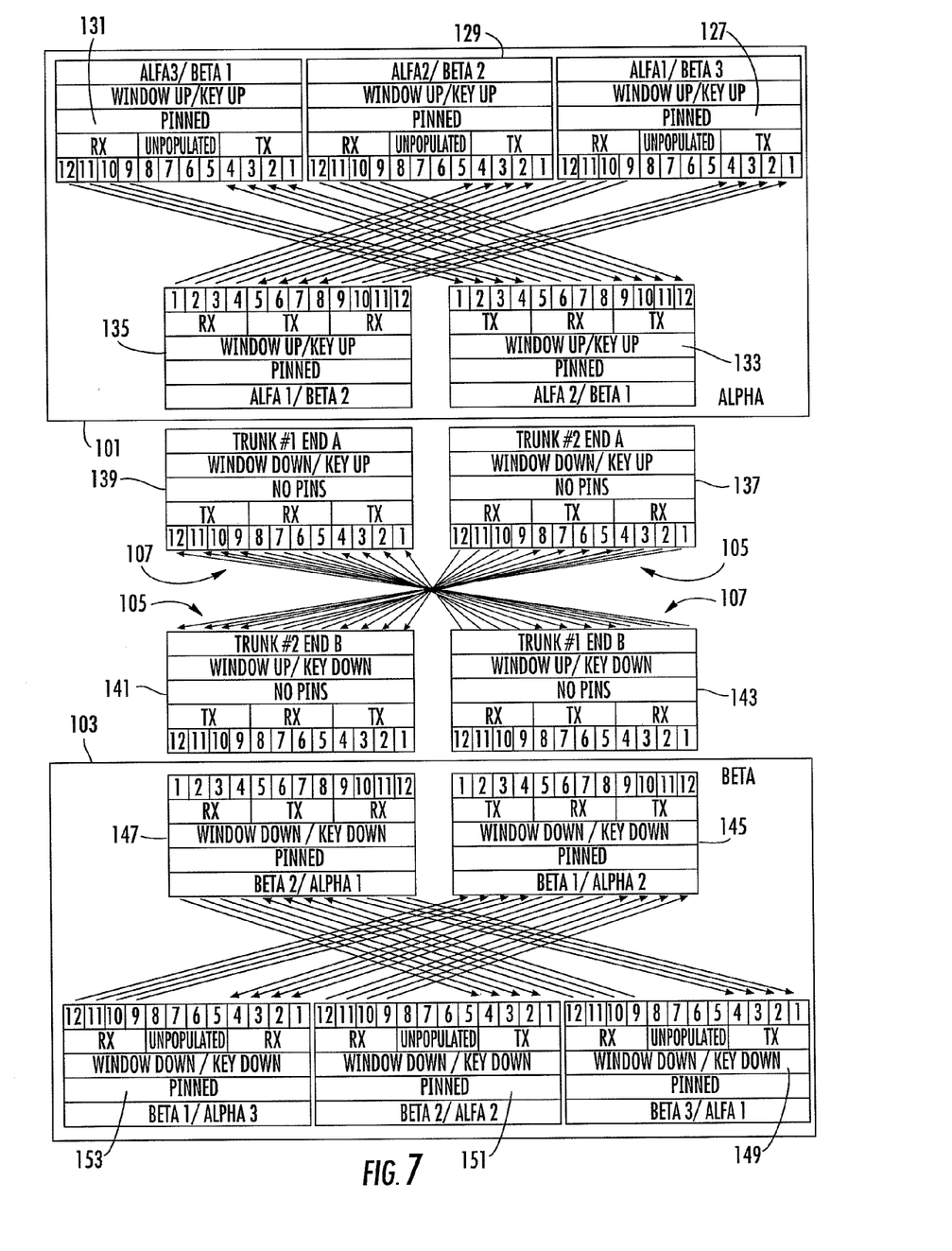
FIG. 7 is a schematic diagram showing the interconnections within and between the first and second fiber adapter modules of FIG. 5, in accordance with a second embodiment.

FIG. 7 illustrates a second embodiment of the optical interconnections within and between the first and second fiber adapter modules 101 and 103. The second embodiment introduces a half twist in the first and second trunk cables 105 and 107. Such a twist of the trunk cables may be preexisting in some trunk cable installations and can readily be imparted due to the flexibility of the trunk cables. It also introduces a different connectivity within the adapter modules 101 and 103 compared to that of FIG. 6. These changes place the trunk-side and transceiver-side ports in the same relative spatial positions when the user faces the adapter modules from either end of the communications channel. For example, the trunk-side ports 135 and 145 to which trunk cable 107 attaches are both on the left of their respective adapter modules 101 and 103 when viewed facing the trunk-side ports.

In FIG. 7, the four transmit channels (e.g., channels 1-4) of the first fiber optic transceiver 109 pass thru patch cord 121 (shown in FIG. 5) and enter into the receive (Rx) channels 9-12 of the first transceiver-side port 127 and are passed to the transmit (Tx) channels 5-8 of the second trunk-side port 135. The four receive (Rx) channels 9-12 of the second trunk-side port 135 are passed to the four transmit (Tx) channels 1-4 of the first transceiver-side port 127, then exit the first receiver-side port 127 into patch cord 121 for connection to the four receive channels (e.g., channels 9-12) of the first fiber optic transceiver 109.

The four transmit channels (e.g., channels 1-4) of the second fiber optic transceiver 111 pass thru patch cord 123 (shown in FIG. 5) and enter into the receive (Rx) channels 9-12 of the second transceiver-side port 129 and are passed to the transmit (Tx) channels 9-12 of the first trunk-side port 133. The four receive (Rx) channels 1-4 of the second trunk-side port 135 are passed to the four transmit (Tx) channels 1-4 of the second transceiver-side port 129, then exit the second receiver-side port 129 into patch cord 123 for connection to the four receive channels (e.g., channels 9-12) of the second fiber optic transceiver 111.

The four transmit channels (e.g., channels 1-4) of the third fiber optic transceiver 113 pass thru patch cord 125 (shown in FIG. 5) and enter into the receive (Rx) channels 9-12 of the third transceiver-side port 131 and are passed to the transmit (Tx) channels 1-4 of the first trunk-side port 133. The four receive (Rx) channels 5-8 of the first trunk-side port 133 are passed to the four transmit (Tx) channels 1-4 of the third transceiver-side port 131, then exit the third receiver-side port 131 into patch cord 125 for connection to the four receive channels (e.g., channels 9-12) of the third fiber optic transceiver 113.

The signals at the first and second trunk-side ports 133 and 135 are connected to the first and second trunk connector plugs 137 and 139 at the first ends of the first and second trunk cables 105 and 107. The signals pass along the first and second trunk cables 105 and 107 to/from the third and fourth trunk connector plugs 141 and 143 which are connected to the fourth and third trunk-side ports 147 and 145 of the second fiber adapter module 103, respectively, due to the twist in the first and second trunk cables 105 and 107.

At the second fiber adapter module 103, the signals from/to the third and fourth trunk-side ports 145 and 147 are connected to optical interconnections, the signal direction of which are reversed relative to the optical interconnections made in the first fiber adapter module 101. As illustrated, the two adapter modules 101 and 103 provide this functionality with identical internal signal routing. This fact becomes apparent by realizing that adapter module 103 is a reoriented version of adapter module 101. This reorientation can be envisioned by folding FIG. 7 horizontally in the center such that the top of adapter module 101 becomes the bottom of adapter module 103. These two orientations are labeled ALPHA for adapter module 101 and BETA for adapter module 103. By this arrangement, the four transmit channels of the second fiber optic transceiver 111 communicate to the four receive channels of the fifth fiber optic transceiver 117, the four receive channels of the second fiber optic transceiver 111 communicate to the four transmit channels of the fifth fiber optic transceiver 117, and so forth.

Figure 8:
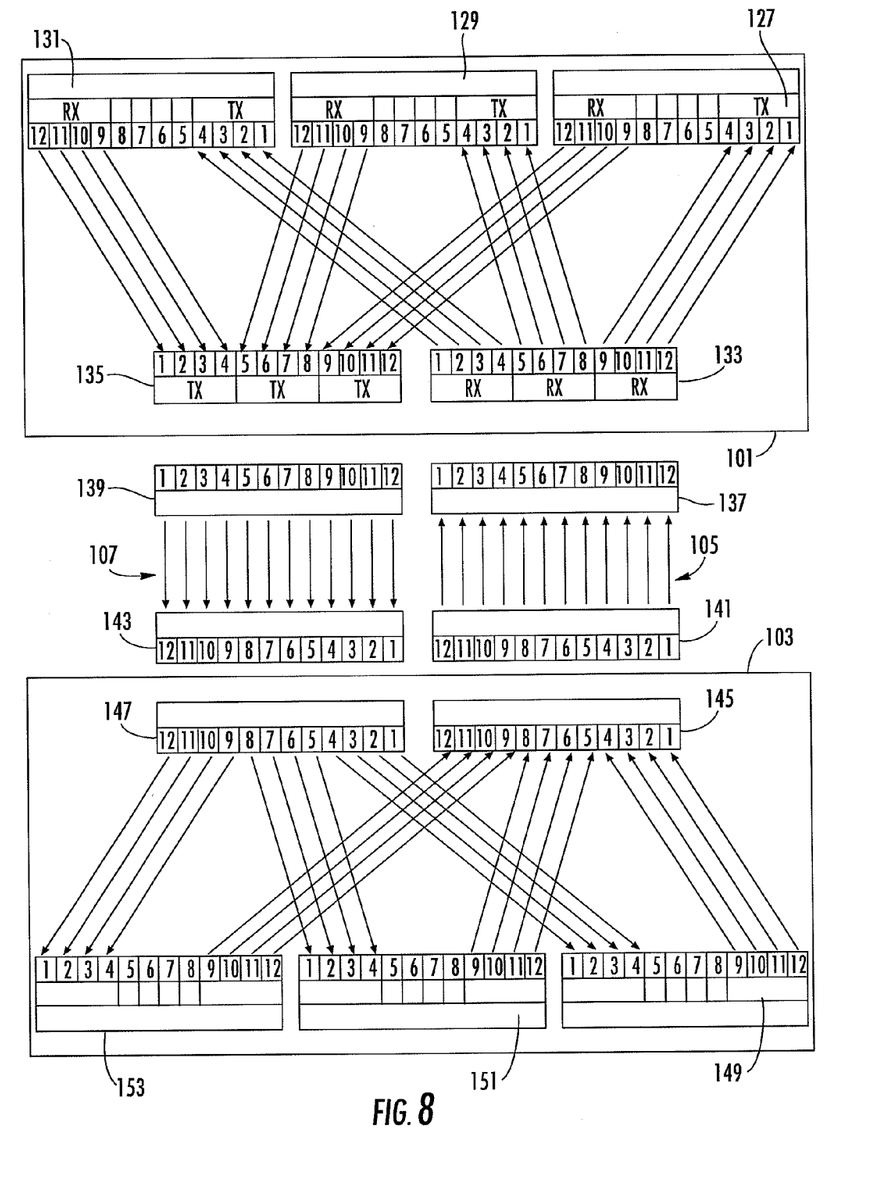
FIG. 8 is a schematic diagram showing the interconnections within and between the first and second fiber adapter modules of FIG. 5, in accordance with a third embodiment.

FIG. 8 illustrates a third embodiment of the optical interconnections within and between the first and second fiber adapter modules 101 and 103. The third embodiment places all transmit channels on one trunk cable and all receive channels on the other trunk cable. In FIG. 8, the four transmit channels (e.g., channels 1-4) of the first fiber optic transceiver 109 pass thru patch cord 121 (shown in FIG. 5) and enter into the receive (Rx) channels 9-12 of the first transceiver-side port 127 and are passed to the transmit (Tx) channels 9-12 of the second trunk-side port 135. The four receive (Rx) channels 9-12 of the first trunk-side port 133 are passed to the four transmit (Tx) channels 1-4 of the first transceiver-side port 127, then exit the first receiver-side port 127 into patch cord 121 for connection to the four receive channels (e.g., channels 9-12) of the first fiber optic transceiver 109.

The four transmit channels (e.g., channels 1-4) of the second fiber optic transceiver 111 pass thru patch cord 123 (shown in FIG. 5) and enter into the receive (Rx) channels 9-12 of the second transceiver-side port 129 and are passed to the transmit (Tx) channels 5-8 of the second trunk-side port 135. The four receive (Rx) channels 5-8 of the first trunk-side port 133 are passed to the four transmit (Tx) channels 1-4 of the second transceiver-side port 129, then exit the second receiver-side port 129 into patch cord 123 for connection to the four receive channels (e.g., channels 9-12) of the second fiber optic transceiver 111.

The four transmit channels (e.g., channels 1-4) of the third fiber optic transceiver 113 pass thru patch cord 125 (shown in FIG. 5) and enter into the receive (Rx) channels 9-12 of the third transceiver-side port 131 and are passed to the transmit (Tx) channels 1-4 of the second trunk-side port 135. The four receive (Rx) channels 1-4 of the first trunk-side port 133 are passed to the four transmit (Tx) channels 1-4 of the third transceiver-side port 131, then exit the third receiver-side port 131 into patch cord 125 for connection to the four receive channels (e.g., channels 9-12) of the third fiber optic transceiver 113.

The signals at the first and second trunk-side ports 133 and 135 are connected to the first and second trunk connector plugs 137 and 139 at the first ends of the first and second trunk cables 105 and 107. The signals pass along the first and second trunk cables 105 and 107 to/from the third and fourth trunk connector plugs 141 and 143 which are connected to the third and fourth trunk-side ports 145 and 147 of the second fiber adapter module 103, respectively.

At the second fiber adapter module 103, the signals from/to the third and fourth trunk-side ports 145 and 147 are connected to optical interconnections which route the transmit and receive channels to the appropriate receive and transmit channels of the fourth, fifth and sixth fiber optic transceivers 115, 117 and 119. By this arrangement, the four transmit channels of the third fiber optic transceiver 113 communicate to the four receive channels of the sixth fiber optic transceiver 119, the four receive channels of the third fiber optic transceiver 113 communicate to the four transmit channels of the sixth fiber optic transceiver 119, and so forth. As with the embodiments of FIGS. 6 and 7, the internal signal routing within adapter modules 101 and 103 of FIG. 8 are identical.

Although FIGS. 6-8 have illustrated three possible optical interconnection possibilities within and between the first and second fiber adapter modules 101 and 103, other arrangements are possible and should not be considered a departure from the spirit of the present invention, as set forth in several of the appended claims. At present, it is believed that the interconnections of FIG. 7 are the preferred embodiment, as this embodiment offers good compatibility with prior networking systems of the multimode and single mode varieties and it preserves the spatial relationship of the ports on both ends of the channel.

In the preferred embodiment, the MPO ports and connector plugs of the present invention are keyed and gendered, in a same or similar manner to the keying and gendering of existing fiber optic transceivers, e.g., as depicted in FIGS. 1 and 3. FIGS. 6 and 7 indicate the male and female (e.g., "pinned" or "no pins") status of the MPO connector plugs and ports. Also, FIGS. 6 and 7 indicate the position of the key as "key up" or "key down." Again, the gender selection and keying arrangement is intended to make the fiber adapter modules 101 and 103 of the present invention compatible with the existing networking single mode and multimode implementations.

Although the fiber adapter module of the present invention has been described as employing MPO connectors, other types of multi-fiber connectors could be employed. An important feature of the present invention is to better utilize, preferably fully utilize, the fibers present in multi-fiber trunk cables through the employment of fiber adapter modules at the ends of the multi-fiber trunk cables. The particular connector design is an ancillary aspect, although MPO fiber connectors are currently a popular and preferred connector envelope for the multi-fiber connectors.

Also, although a fiber adapter module having three transceiver ports translating to two trunk ports has been shown and described, the teaching of the present invention could be applied to expand the size of the fiber adapter module to accommodate more transceivers and more trunk cables. For example, each fiber adapter module could have six transceiver ports and four trunk ports, or nine transceiver ports and six trunk ports. Also the trunk cables could contain more than twelve fibers, for example a single trunk cable containing twenty four fibers. In other words, the first and second trunk cables 105 and 107 could be replaced by a single trunk cable having twenty-four fibers in a single jacket, and the two trunk-side MPO ports of each fiber adapter module could be replaced by a single, trunk-side MPO port having twenty four fiber ends (e.g., two rows having twelve fiber ends each).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A fiber adapter module comprising:
    a trunk-side port for receiving a connector plug of a multi-fiber trunk cable;
    a plurality of transceiver-side ports for receiving connector plugs carrying both transmit channels and receive channels for at least a first fiber optic transceiver and a second fiber optic transceiver; and
    optical interconnections within said fiber adapter module to place at least one transmit channel or at least one receive channel of the first fiber optic transceiver at said trunk-side port and to place at least one transmit channel or at least one receive channel of the second fiber optic transceiver at said trunk-side port, wherein said trunk-side port is a first trunk-side port formed by a twelve fiber MPO receptacle, said fiber adapter module further comprising:
    a second trunk-side port for receiving a connector plug of a multi-fiber trunk cable, wherein said second trunk-side port is formed by a twelve fiber MPO receptacle; and
    wherein said plurality of transceiver-side ports includes:
    a first twelve fiber MPO transceiver-side port for passing four transmit channels and four receive channels of the first fiber optic transceiver to said optical interconnections;
    a second twelve fiber MPO transceiver-side port for passing four transmit channels and four receive channels of the second fiber optic transceiver to said optical interconnections; and
    a third twelve fiber MPO transceiver-side port for passing four transmit channels and four receive channels of a third fiber optic transceiver to said optical interconnections.

2. The fiber adapter module according to claim 1, wherein said optical interconnections pass the four transmit channels of said first, second and third twelve fiber MPO transceiver ports to said first trunk-side port, and wherein said optical interconnections pass the four receive channels of said first, second and third twelve fiber MPO transceiver ports to said second trunk-side port.

3. The fiber adapter module according to claim 1, wherein said optical interconnections pass:
    the four transmit channels of said first and second twelve fiber MPO transceiver-side ports to said first trunk-side port;
    the four receive channels of said second and third twelve fiber MPO transceiver-side ports to said second trunk-side port;
    the four receive channels of said first twelve fiber MPO transceiver-side port to said first trunk-side port; and
    the four transmit channels of said third twelve fiber MPO transceiver-side port to said second trunk-side port.

4. The fiber adapter module according to claim 1, wherein said optical interconnections pass:
    the four transmit channels of said first and second twelve fiber MPO transceiver-side ports to said second trunk-side port;
    the four receive channels of said second and third twelve fiber MPO transceiver-side ports to said first trunk-side port;
    the four receive channels of said first twelve fiber MPO transceiver-side port to said second trunk-side port; and
    the four transmit channels of said third twelve fiber MPO transceiver-side port to said first trunk-side port.

5. The fiber adapter module according to claim 1, wherein said first and second trunk-side ports are formed by male MPO ports.

6. The fiber adapter module according to claim 5, wherein said first and second trunk-side ports are keyed.

7. The fiber adapter module according to claim 5, wherein said first, second and third twelve fiber transceiver-side ports are formed by male MPO ports.

8. The fiber adapter module according to claim 7, wherein said first and second trunk-side ports and said first, second and third twelve fiber transceiver-side ports are keyed.

9. The fiber adapter module according to claim 1, further comprising:
    a housing;
    wherein said first and second trunk-side ports are mounted to said housing;
    wherein said first, second and third transceiver-side ports are mounted to said housing; and
    wherein optical interconnections within said fiber adapter module connect eight fibers of said first transceiver-side port, eight fibers of said second transceiver-side port and eight fibers of said third transceiver-side port to the twenty four fibers of said first and second trunk-side ports.

10. The fiber adapter module according to claim 9, wherein said first and second trunk-side ports are formed by male MPO ports.

11. The fiber adapter module according to claim 10, wherein said first and second trunk-side ports are keyed.

12. The fiber adapter module according to claim 10, wherein said first, second and third transceiver-side ports are formed by male MPO ports.

13. The fiber adapter module according to claim 12, wherein said first and second trunk-side ports and said first, second and third transceiver-side ports are keyed.

14. The fiber adapter module according to claim 9, wherein said optical interconnections pass four transmit channels of said first, second and third transceiver-side ports to said first trunk-side port, and wherein said optical interconnections pass four receive channels of said first, second and third transceiver-side ports to said second trunk-side port.

15. The fiber adapter module according to claim 9, wherein said optical interconnections pass:
    four transmit channels of said first and second transceiver-side ports to said first trunk-side port;
    four receive channels of said second and third transceiver-side ports to said second trunk-side port;
    four receive channels of said first transceiver-side port to said first trunk-side port; and
    four transmit channels of said third transceiver-side port to said second trunk-side port.

16. The fiber adapter module according to claim 9, wherein said optical interconnections pass:
   four transmit channels of said first and second transceiver-side ports to said second trunk-side port;
   four receive channels of said second and third transceiver-side ports to said first trunk-side port;
   four receive channels of said first transceiver-side port to said second trunk-side port; and
   four transmit channels of said third transceiver-side port to said first trunk-side port.

* * * * *